(12) United States Patent
Roland et al.

(10) Patent No.: US 6,713,563 B2
(45) Date of Patent: Mar. 30, 2004

(54) ELECTROSTRICTIVE POLY(VINYLIDENE FLUORIDE-CO-TRIFLUOROETHYLENE) NETWORKS

(75) Inventors: Charles M. Roland, Waldorf, MD (US); Riccardo Casalini, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/113,652

(22) Filed: Mar. 29, 2002

(65) Prior Publication Data

US 2003/0187143 A1 Oct. 2, 2003

(51) Int. Cl.$^7$ .............................................. C08F 214/22
(52) U.S. Cl. ..................... 525/276; 525/263; 525/273; 526/247; 526/253; 526/255
(58) Field of Search .................. 525/276, 263, 525/273; 526/247, 253, 255

(56) References Cited

U.S. PATENT DOCUMENTS

| | | | |
|---|---|---|---|
| 4,583,096 A | 4/1986 | Bellman et al. | |
| 4,891,651 A | 1/1990 | Staehlin et al. | |
| 5,365,239 A | 11/1994 | Stilwell, Jr. | |
| 6,326,436 B2 * | 12/2001 | Bowers | ...................... 525/264 |

OTHER PUBLICATIONS

Science, "Giant Electrostriction and Relaxor Ferroelectric Behavior in Electron–Irradiated Poly(Vinylidene Q.M. Zhang Fluoride–Trifluoroethylene)Copolymer" vol. 280 pp. 2101–2104., Jun. 26, 1998.

Applied Physics Letters"Network Structure in Poly(Vinylidene Fluoride–Trifluoroethylene Electrostrictive Films" vol. 78 No. 5, pp. 622–624, 2001, G.S. Buckley.

Polymer Preprints 2000"Synthesis and Electric Properties of VDF/TRFE/HFP Terpolymers" 41(2)., pp. 1558–1559, 2000, A. Petchsuk.

R. Casalini Applied Physics Letters"Highly Electrostrictive Poly(Vinylidene Fluoride–Trifluoroethylene) Networks" vol. 79 No. 16, pp. 2627–2629, 2001.

Rubber Chemistry and Technology"*Curing of Fluoroelastomers by Peroxides*" vol. 55, pp. 1004–1017, D. Apotheker, 1982.

Prog. Polymer Science"Chemistry of Fluorocarbon Elastomers" vol. 14, 251–296, 1989, A. Logothetis.

* cited by examiner

*Primary Examiner*—James J. Seidleck
*Assistant Examiner*—Olga Asinovsky
(74) *Attorney, Agent, or Firm*—John J. Karasek; Joseph T. Grunkemeyer

(57) ABSTRACT

A process for making a vinylidene fluoride-co-trifluoroethylene networked polymer comprising the steps of: providing a poly(vinylidene fluoride-co-trifluoroethylene) copolymer; mixing the copolymer with a peroxide and a coagent to form a curing mixture; and processing the curing mixture such that the peroxide, in combination with the coagent, crosslinks the copolymer to form a networked polymer.

27 Claims, 2 Drawing Sheets

ELECTROSTRICTIVE POLY(VINYLIDENE FLUORIDE-CO-TRIFLUOROETHYLENE) NETWORKS

BACKGROUND OF THE INVENTION

1. Field of the Invention

The invention relates to processes for forming poly (vinylidene fluoride-co-trifluoroethylene) networked polymers. The networked polymers formed by the process have high electrostrictive coefficients.

2. Description of the Related Art

Electromechanically active materials convert electrical energy into mechanical displacements, with lower power consumption than electromagnetic motors. The electrically induced strain has at least two components including piezoelectric strain and electrostrictive strain, shown in Equation 1. While piezoelectric strains are proportional to the applied electric field, E, the electrostrictive strain increases quadratically with the field. Thus, materials with substantial electrostrictive coefficients offer the possibility of obtaining very large deformations while requiring low power consumption. Further, since the strain is proportional to the square of the field, the strain is in the same direction regardless of the polarity of the applied field. Applications of electrostrictive materials include sonar, sensors, transducers, actuators, and potentially robotics and artificial muscles.

$$s = dE + aE^2 \qquad (1)$$

Piezo-ceramics (e.g., lead zirconate titanate (PZT), lead zirconate, lead titanate, lead metaniobate, lead magnesium niobate) have been the material of choice for sensors and transducers, combining good electromechanical properties with a large modulus ($\geq 100$ GPa). Modulus is an important property of electromechanically active materials, since it contributes to the conversion efficiency, which is defined as the fraction of input electrical energy converted to mechanical energy. The drawbacks to ceramics include their brittleness (cyclic strains <0.05%) and poor processability. Although ceramics are the dominant materials for such applications, there is great interest in developing electromechanically active polymers, given their superior processability and toughness, as well as lighter weight (especially important for aviation applications). Polymers offer potential advantages over ceramics, such as greater toughness, reduced weight (six times less dense than ceramics), and processability. Not only can polymers be formed into large, complex shapes, but they can also be used to produce small electromechanical devices by embossing a polymer film with microelectronic devices such as amplifiers.

Electromechanically active polymers must, of course, be polar. However, macroscopic alignment of molecular dipoles is limited for polymers, since they are rarely ordered on the microscopic level. Even among highly crystalline polymers, whose orientation can be high, there are few cases in which the chains can both undergo conformational changes and adopt more than one stable configuration (in order to allow switching response to an external field). As a consequence, only a few polymers are electromechanically active. Among polymers, only poly(vinylidene fluoride) (PVDF) and its trifluoroethylene copolymer p(VDF-TrFE) have had any commercial impact. The copolymers perform better than the homopolymers because they spontaneously crystallize into the all-trans β-crystalline phase, and their Curie temperatures are below their melting points. These copolymers can have both piezoelectric and electrostrictive properties.

PVDF piezoelectric films have been commercially available since 1980, and are utilized in audio devices (microphones, high frequency speakers, and ultrasonic transducers), gauges (accelerometers, strain gauges, and load cells), and actuators (electronic fans and light shutters). However, the piezoelectric effect is more than an order of magnitude smaller than PZT, the most commonly used ceramic. For sonic transducer applications, PVDF-based materials can compete commercially with ceramics only as sound receivers, not as sound projectors.

The electrostrictive properties of p(VDF-TrFE) can be enhanced by forming crosslinked networks of the copolymer. Crosslinking reduces the size of the all-trans crystallites, making them more mobile and more able to react to an applied electric field. Irradiating the copolymer with high-energy electrons (Lovinger, Macromolecules 18, 910 (1985)) or gamma rays (Wang, Ferroelectrics 41, 213 (1982)) are known ways to form crosslinks. Zhang et al., Science 280, 2010 (1998) disclosed measurements of the electrostrictive properties of electron irradiated p(VDF-TrFE) films. The irradiated film exhibited strains as high as 4% in the thickness direction under an electric field of 150 MV/m. A disadvantage of irradiation is that it causes chain scission, isomerization, and bond rearrangement in addition to crosslinking. These side reactions create free radicals that can degrade the physical properties of the networked polymer. The degradation can continue for a period of years. Another drawback of irradiation is the inherent nonuniform energy distribution leading to nonuniform crosslink density.

Buckley et al., Appl. Phys. Lett. 78, 622 (2001) disclosed a chemical process to crosslink a cast film of a solution of p(VDF-TrFE) and a peroxide. The peroxide crosslinked the copolymer to form a network. This chemical process allowed for a more uniform crosslink density. However, the crosslink density was much lower than in irradiated films. Further, the chemically crosslinked network showed the same degree of chain scission as the irradiated films.

Logothetis, Prog. Polym. Sci. 14, 251 (1989) summarized chemical processes to crosslink vinylidene fluoride and its copolymers with incorporated cure site monomers. The cure site monomer contained either bromine or iodine. The copolymer was reacted with a peroxide and a radical trap. Crosslinking occurred only at the cure site monomers, and the reaction would not proceed in the absence of a cure site monomer. This process has the disadvantage that non-crosslinked cure site monomers can disrupt the crystallinity and degrade the electromechanical properties.

A process is needed to crosslink p(VDF-TrFE) with a crosslink density high enough to improve the electrostrictive properties while minimizing side reactions that degrade physical properties. The process should be a chemical process to provide uniform crosslink density. Further, the process should not require the use of extra cure site monomers. The process could be used to make an electrostrictive film with less weight than piezo-ceramics, but with improved toughness and processability.

SUMMARY OF THE INVENTION

It is an object of the invention to provide chemical processes to crosslink poly(vinylidene fluoride-co-trifluoroethylene) while minimizing degradative side reactions.

It is a further object of the invention to provide poly (vinylidene fluoride-co-trifluoroethylene) networked polymers with high electrostrictive coefficients, capable of higher strains in lower electric fields than the prior art compositions.

It is a further object of the invention to provide electrostrictive films comprising poly(vinylidene fluoride-co-trifluoroethylene) networked polymers.

These and other objects of the invention can be accomplished by a process for making a poly(vinylidene fluoride-co-trifluoroethylene) networked polymer comprising the steps of: providing a poly(vinylidene fluoride-co-trifluoroethylene) copolymer; mixing the copolymer with a peroxide and a coagent to form a curing mixture; and processing the curing mixture such that the peroxide, in combination with the coagent, crosslinks the copolymer to form the networked polymer.

The invention further comprises poly(vinylidene fluoride-co-trifluoroethylene networked) polymers made by the above process.

The invention further comprises electrostrictive films comprising the above networked polymer.

LIST OF REFERENCE NUMBERS

Figure 1:
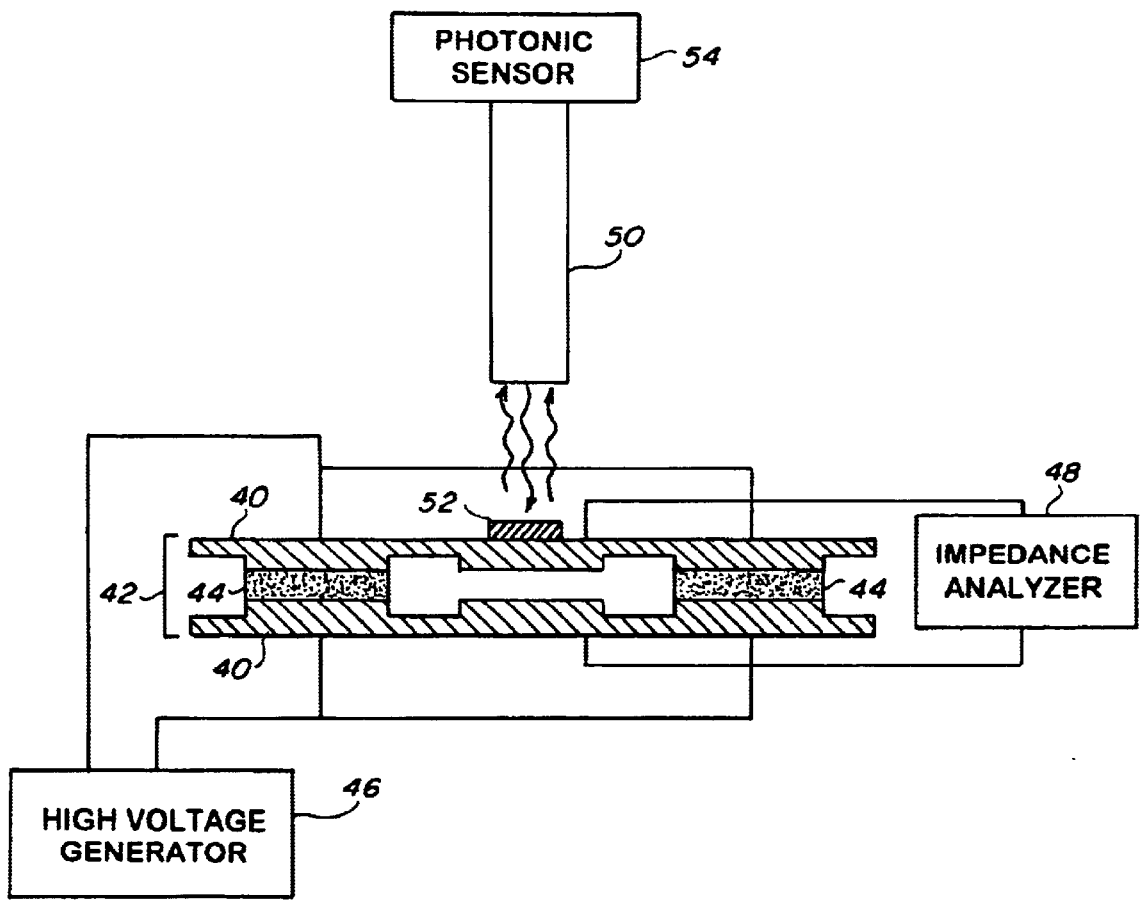
FIG. 1 schematically illustrates an apparatus used to measure the electrostrictive strain in a film.

40 Capacitor electrode
42 Air-gap capacitor
44 p(VDF-TrFE) sample film
46 High voltage generator
48 Impedance analyzer
50 Optical fibers
52 Reflector
54 Photonic sensor

DETAILED DESCRIPTION OF THE PREFERRED EMBODIMENTS

The process of the invention comprises three steps: providing a poly(vinylidene fluoride-co-trifluoroethylene) copolymer; mixing the copolymer with a peroxide and a coagent to form a curing mixture; and processing the curing mixture such that the peroxide, in combination with the coagent, crosslinks the copolymer to form a networked polymer. The coagent is also referred to in the art as a radical trap. The properties of the networked polymer can be controlled by manipulating, among other parameters, the processing conditions and the amounts and choices of copolymer, peroxide, and coagent. As used herein, the terms copolymer, peroxide, and coagent include combinations of multiple copolymers, peroxides, and coagents.

Reaction Scheme

The proposed mechanism for the reaction includes several steps. The proposed mechanism is not intended to limit the scope of the process. First, the peroxide molecule decomposes producing two molecules of a species containing an oxygen radical, referred to as an oxyradical. Peroxide bonds are typically unstable compared to most other covalent bonds. These bonds rapidly break apart, particularly at elevated temperatures, into a pair of molecules, each containing an oxygen radical.

PEROXIDE→2OXYRADICAL (2)

The oxygen radical species may spontaneously break apart into a species containing a carbonyl group and an initiating radical. This step may or may not occur depending on the choice of peroxide.

OXYRADICAL→CARBONYL+INITIATING RADICAL (3)

Either the oxyradical or the initiating radical, whichever is present, acts as an initiator to the coagent. The initiator and coagent react to create a radical coagent.

OXYRADICAL or INTIATING RADICAL+COAGENT→RADICAL COAGENT (4)

This radical coagent extracts a fluorine atom from the copolymer, which creates a copolymer radical and a fluorinated coagent.

RADICAL COAGENT+COPOLYMER→FLUORINATED COAGENT+COPOLYMER RADICAL (5)

The copolymer radical then reacts with another coagent (or another reactive site of the same coagent), creating a covalent bond between the copolymer and coagent. This new species is a copolymer/coagent radical.

COPOLYMER RADICAL+COAGENT→COPOLYMER/COAGENT RADICAL (6)

The copolymer/coagent radical can then extract another fluorine from another copolymer (or another part of the same copolymer) to make another copolymer radical and a fluorinated copolymer/coagent.

COPOLYMER/COAGENT RADICAL+COPOLYMER→FLUORINATED COPOLYMER/COAGENT+COPOLYMER RADICAL (7)

This new copolymer radical reacts with another coagent as shown above in formula 6 and the process repeats, forming new fluorinated copolymer/coagents and new copolymer radicals. Since the coagent has at least two reactive sites, one molecule of coagent can react with multiple copolymers, which results in a crosslinked networked polymer. The peroxide and coagent together are the rate limiting reactants.

The following describes the proposed mechanism using the specific reactants of dicumyl peroxide and trimethallyl isocyanurate. Other minor reactions may occur, but the following are the dominant proposed reaction paths. The dicumyl peroxide decomposes at elevated temperatures into two oxycumyl radicals.

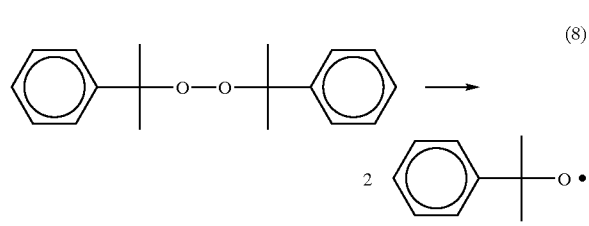
(8)

The oxycumyl radical then spontaneously decomposes into a phenyl radical and acetone.

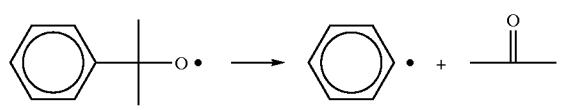
(9)

The phenyl radical and a methylene carbon in trimethallyl isocyanurate react to make a (2-methyl-3-phenylpropyl) dimethallyl isocyanurate radical.

(10)

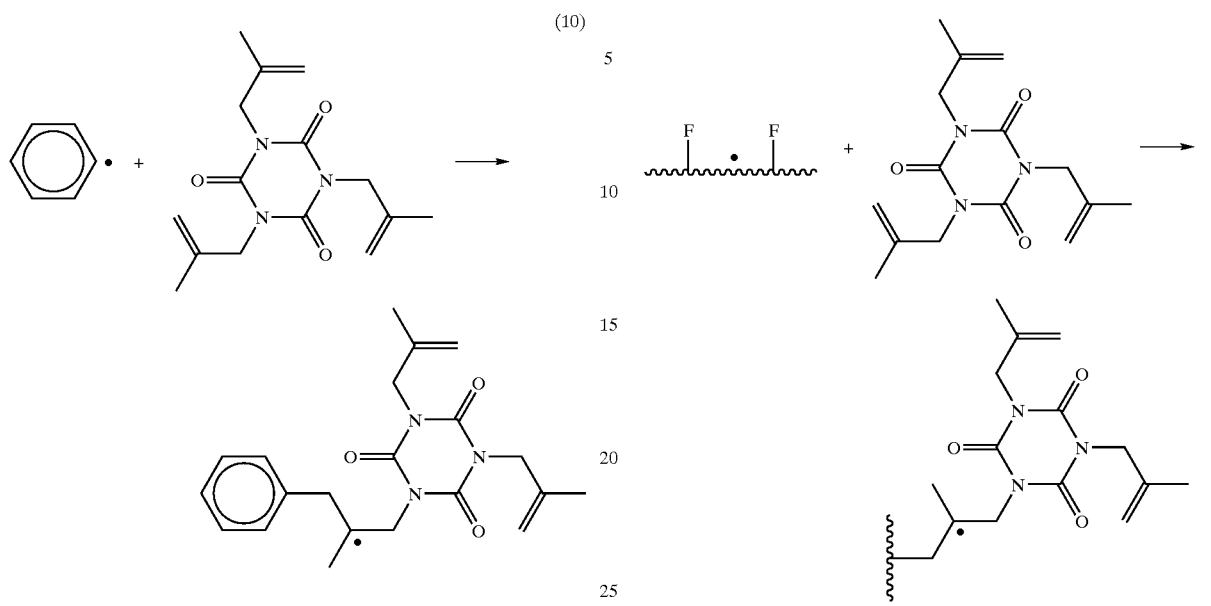

The (2-methyl-3-phenylpropyl) dimethallyl isocyanurate radical then extracts a fluorine from the copolymer to make (2-methyl-2-fluoro-3-phenylpropyl) dimethallyl isocyanurate and a copolymer radical.

(11)

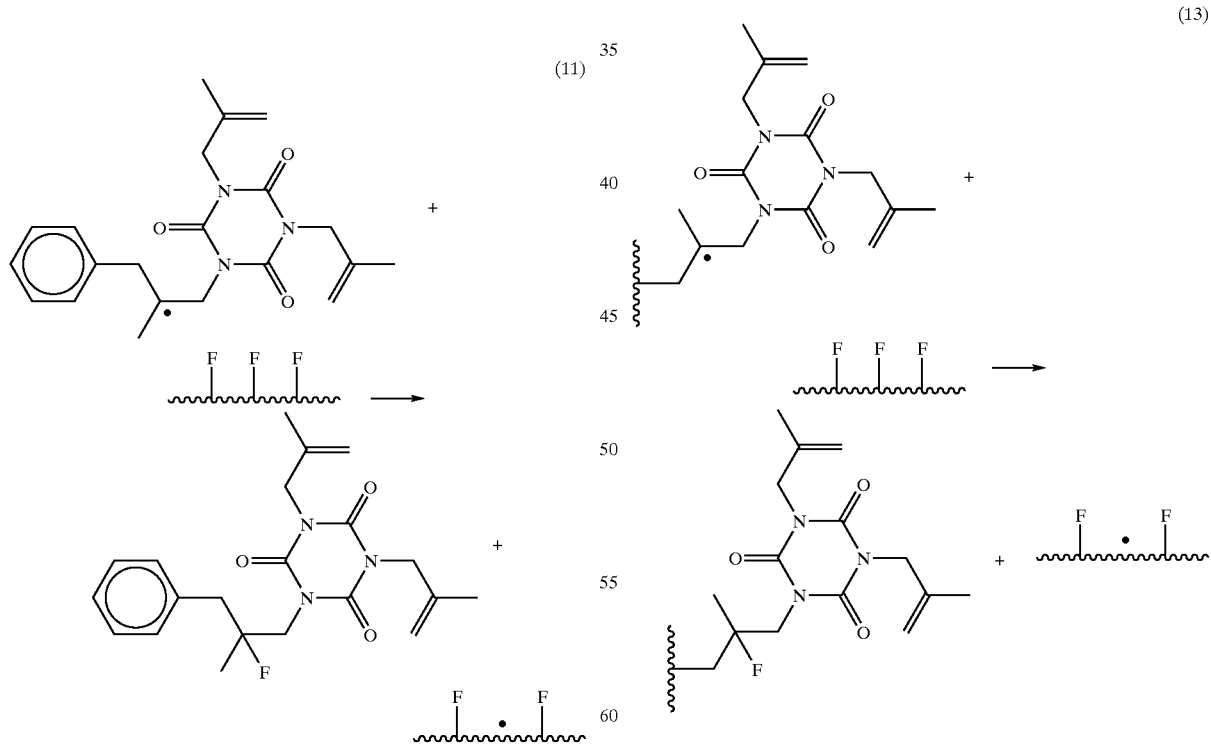

The copolymer radical reacts with a methylene carbon in trimethallyl isocyanurate to make a copolymer-isocyanurate radical.

(12)

The copolymer-isocyanurate radical reacts with more copolymer to make fluorinated copolymer-isocyanurate and another copolymer radical.

(13)

The new copolymer radical reacts with trimethallyl isocyanurate, potentially with a molecule that has already reacted with other copolymer chains. The process in formulas 11 and 12 repeats and leads to a networked polymer.

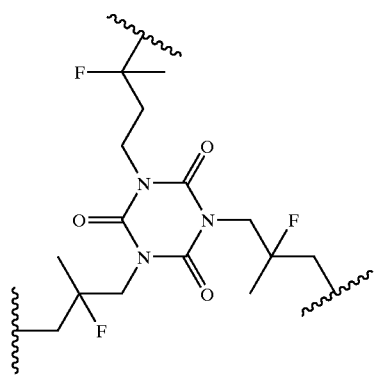

(14)

Choice of Reactants

Poly(vinylidene fluoride-co-trifluoroethylene) copolymers are commercially available from a variety of sources. They can be obtained in a range of molecular weights. Random copolymers are preferred because the crystallite size may be smaller than in block copolymers, making the crystallites more mobile and responsive to an electric field. The molar ratio of the two monomers can also be selected. A higher percentage of vinylidene fluoride will raise the Curie temperature of the networked polymer. Most materials lose their electromechanical properties when heated above the Curie temperature. A higher percentage of vinylidene fluoride may be desirable when higher operational temperatures of the electrostrictive network polymer are needed. Preferably the mole percent vinylidene fluoride in the copolymer is from about 40% to about 95% and more preferably from about 60% to about 75%.

The peroxide is preferably a strong peroxide such as dicumyl peroxide (DCP). Strong peroxides are known in the art. A strong peroxide is desirable because a higher temperature is required for it to decompose, and because strong peroxides are better able to initiate the free-radical reaction. Preferably, the temperature required for substantial reaction of the peroxide is higher than the melting point of the copolymer. This property leads to one advantage of the strong peroxide in that it is non-reactive at room temperature. Thus, the reaction can be prevented prior to further processing. Another advantage is that any peroxide remaining after crosslinking and cooling will not initiate more reactions, including side reactions that may degrade the physical properties. Another suitable peroxide is $\alpha,\alpha'$-bis(t-butylperoxy)diisopropylbenzene (VUL-Cup). An example of a weaker peroxide that may not be suitable in most cases is benzoyl peroxide.

Coagents, also known as radical traps, are known in the art. The coagent should be selected based on its functionality and its radical strength. A higher functionality may be preferred because it allows for a greater degree of crosslinking and reduction of crystallite size. Trimethallyl isocyanurate (sold by DuPont as Diak 8) is a preferred coagent. 4'-methylenebis(cyclohexylamine)carbamate (sold by Vanderbilt as Diak 4) is another suitable coagent. Triallyl isocyanurate (sold by DuPont as Diak 7) is a suitable coagent when the crosslinking is done in the melt state.

Mixing Step

The copolymer, the peroxide, and the coagent are mixed together to form a curing mixture. The quantities of the reactants can be chosen to obtain desired properties in the networked polymer. Typically, about the same amount by weight of the peroxide and the coagent are used. Preferably the amounts of peroxide and coagent are separately up to about 15% by weight of the amount of copolymer. Generally, the more peroxide and coagent in the curing mixture, the higher the degree of crosslinking and the higher the electrostrictive coefficient of the resulting networked polymer.

The mixing can be done by any means known in the art for mixing reactants that include a polymer. Preferably, the mixing is done mechanically in the melt state because of commercial practicality. The curing mixture can be melted and mixed as part of an extrusion process. Extrusion processes are well known in the art. The extrusion process is desirable because of the already widespread use of the equipment and the efficiency of the continuous process.

Another suitable means for mixing the curing mixture is to dissolve the reactants in a solvent. N,N'-dimethylformamide is a suitable solvent. This method is more appropriate for smaller scale fabrication and testing of films of the networked polymer.

Another potential method of mixing is to dry blend the ingredients, with the degree of dispersion dependent on the fineness of the powders used.

Processing Step

The processing step causes the curing of the copolymer to form the networked polymer. Typically the curing mixture is heated to initiate the crosslinking. The curing mixture may also be pressurized. The heating and pressurizing can be done concomitantly with extrusion of the curing mixture in the melt state. After a desired amount of curing, the networked polymer can be returned to room temperature so that the crosslinking ceases. There can be unreacted peroxide and coagent radicals in the networked polymer. Typically, these unreacted species are not reactive at room temperature and do not lead to significant degradation of physical properties or to further curing.

Preferably the curing mixture is formed into a film during the processing step. This allows for uniform heat and pressure during curing. The film shape is then retained in the finished part. Many practical uses for electrostrictive materials require the use of film. Preferably the film is formed as part of an extrusion process. Extrusion processes capable of forming films are well known in the art.

By their nature, extrusion processes apply heat and pressure to the material being processed. This heat may or may not be sufficient to initiate some curing of the copolymer. Although some curing may occur during extrusion, care must be taken that there is not too much crosslinking prior to completion of the forming operation. This would be evident if it became overly difficult to extrude the curing mixture. After extrusion the curing mixture can then be heated as needed to initiate or finish curing. Means for heating after extrusion are well known in the art. Preferably, the copolymer, the peroxide, and the coagent are mixed together in the melt state and immediately extruded as a film, with completion of the cure to form the networked polymer.

The curing mixture can also be cast as a film from a solution of copolymer, peroxide, and coagent. The solvent is then dried and the film cured. This method is useful for small-scale fabrication where extrusion would be impractical.

Active Sonar

Application of an alternating electric field to an electrostrictive film of the networked polymer will induce deformation of the film in the form of a thickness change. The magnitude of the induced strains will depend, in a known and predictable manner, on the magnitude of the electric field and the electrostrictive coefficient of the material. This induced deformation can be utilized, by well-known techniques, for the production of high frequency (kHz) acoustic energy for sonar applications.

Having described the invention, the following examples are given to illustrate specific applications of the invention. These specific examples are not intended to limit the scope of the invention described in this application.

EXAMPLE 1

Measurement of electrostrictive properties for networked polymer using 10% dicumyl peroxide and 10% trimethallyl isocyanurate—The copolymer was a random p(VDF-TrFE) with 65/35 molar ratio of monomer units of vinylidene fluoride/trifluoroethylene. A 10% solution of the copolymer in N,N'-dimethylformamide was prepared (DMF). To this solution was added 10% by weight of the copolymer each of dicumyl peroxide and trimethallyl isocyanurate. The solution was cast as a film and cured for 40 minutes at 180° C. under pressure. The pressure was about 5000 psi and was applied with a Carver hydraulic press. The film thickness was 75 μm. Equilibrium solvent swelling in DMF confirmed that the crosslinking occurred and that a networked polymer was formed. The crosslink density, measured from solvent swelling, was 0.26 mol/L.

The strain was measured simultaneously by two different methods using the apparatus schematically illustrated in FIG. 1. In the first method, the electrodes 40 of an air-gap capacitor 42 are supported by the sample film 44. Two pieces are used to avoid tilting. To ensure good contact of the sample 44 with the electrodes 40, a pressure of about 1.6 kPa was applied by dead weighting. The separation of the electrodes 40, which is equal to the sample 44 thickness, t, is inversely proportional to the capacitance, C $$t = \epsilon_0 A / C \tag{15}$$

where $\epsilon_0$ is the permittivity of free space ($8.85 \times 10^{-12}$ F/m) and A is the electrode area. A high voltage generator 46 was used to apply the strain-inducing voltage to the capacitor 42. Any change in film thickness displaces the electrodes 40, thus changing the capacitance. The capacitance was measured with an impedance analyzer 48.

The second method is based on a non-interferometric, optical technique. Optical fibers 50 illuminate the capacitor 42, and the light reflected from a small aluminum reflector 52 adhered to the capacitor 42 is collected by parallel, receiving fibers 50. Over a film thickness change of roughly 25 μm, the intensity of this reflected light is proportional to the distance separating the reflecting top surface of the reflector 52 from the optical fibers 50. This intensity is measured with a photonic sensor 54.

This arrangement allows for measurement using both methods at the same time. The variation between the two methods was generally found to be less than 5%. The strain in the networked polymer of this example was measured to be 12% at 9 MV/m. This strain compares favorably to that of an irradiated p(VDF-TrFE), reported as only 4% at 150 MV/m (Zhang et al., Science 280, 2010 (1998)).

The measured strain is affected by the pressure exerted on the electrodes. This pressure can act as a confining stress, reducing the electromechanical response. The effect of pressure on the strain was measured for three thicknesses of film, all made by the method of this example. For the measurements below, the applied electric field was 3.5 MV/m.

| film thickness pressure (kPa) | 60 μm | 80 μm Strain (%) | 320 μm |
| --- | --- | --- | --- |
| 0.6 | 0.15 | 0.72 | 0.38 |
| 1.3 | 0.15 | 0.20 | 0.25 |
| 2.7 | 0.14 | 0.16 | 0.19 |
| 4.0 | 0.17 | 0.10 | 0.13 |
| 5.3 | 0.17 | 0.10 | 0.12 |
| 8.6 | 0.17 | 0.10 | 0.09 |
| 11.2 | 0.09 | 0.10 | 0.06 |
| 15.1 | 0.24 | 0.21 | 0.06 |
| 71.9 | 0.07 | 0.05 | 0.03 |

EXAMPLE 2

Measurement of electrostrictive properties for networked polymer using 7.8% dicumyl peroxide and 8.3% trimethallyl isocyanurate—The networked polymer was prepared and characterized the same as in Example 1 except that 7.8% dicumyl peroxide and 8.3% trimethallyl isocyanurate were used. The crosslink density was 0.05 mol/L. The strain was measured to be 6% at 9 MV/m.

EXAMPLE 3

Measurement of electrostrictive properties for networked polymer using 5% dicumyl peroxide and 5% 4'-methylenebis(cyclohexylamine)carbamate—The networked polymer was prepared and characterized the same as in Example 1 except that 5% dicumyl peroxide and 5% 4'-methylenebis(cyclohexylamine)carbamate were used. The crosslink density was not measured, but it was clearly crosslinked because it was not soluble in DMF. The strain was measured to be 1.5% at 6 MV/m.

EXAMPLE 4

Measurement of electrostrictive properties for networked polymer using 5% dicumyl peroxide and 5% trimethallyl isocyanurate—The networked polymer was prepared and characterized the same as in Example 1 except that 5% dicumyl peroxide and 5% trimethallyl isocyanurate were used. The crosslink density was 0.019 mol/L. The strain was measured to be 4% at 9 MV/m.

EXAMPLE 5

Figure 2:
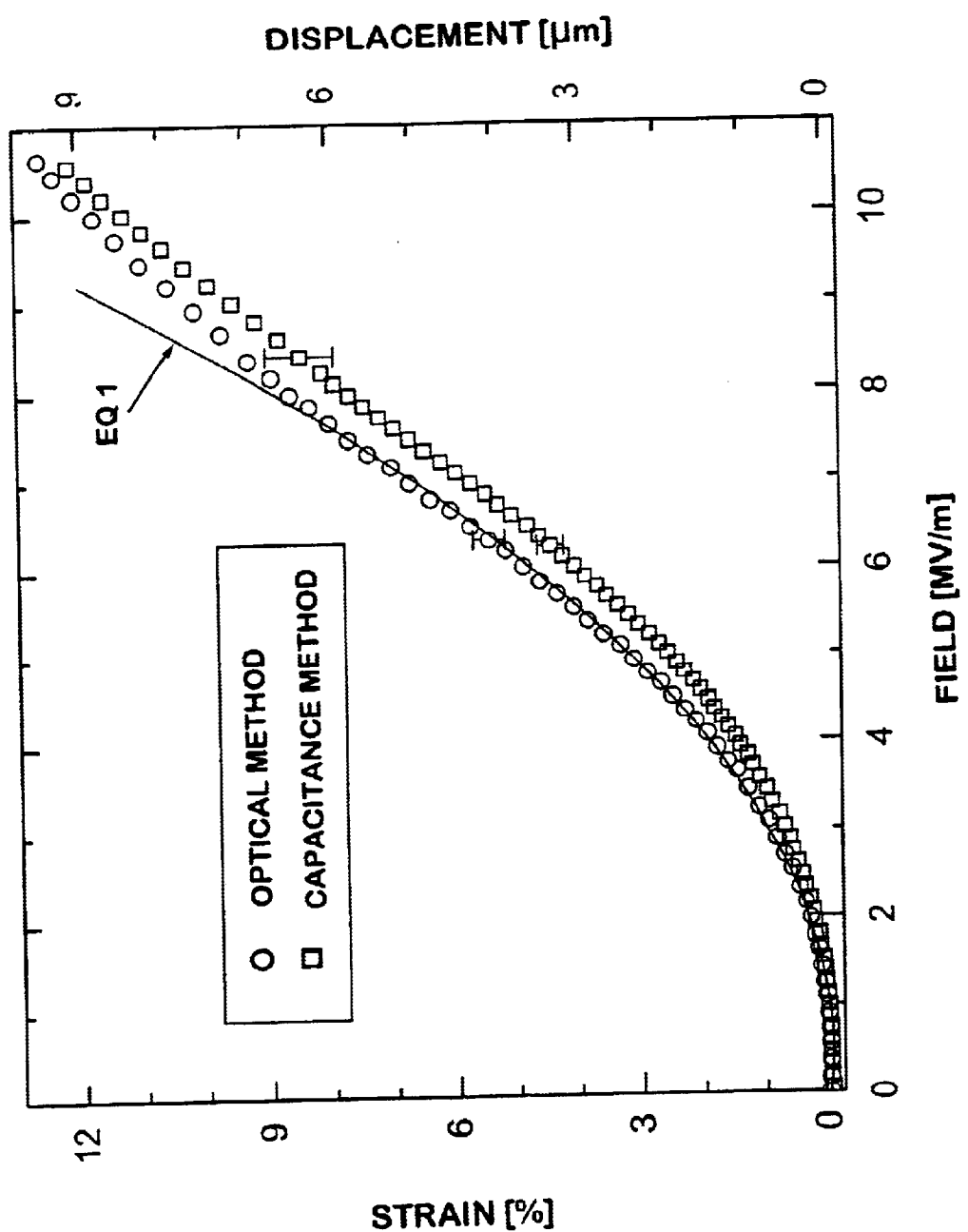
FIG. 2 illustrates a graph of strain as a function of applied electric field for a typical networked polymer of the invention.

Measurement of strain as a function of electric field—FIG. 2 is a graph of strain vs. applied electric field. The strain was measured by both the capacitance method and the optical method. The solid line shows the fit to Equation 1. The piezoelectric constant, d, was determined to be $1.6 \times 10^{-9}$ m/V, and the electrostrictive constant, a, was determined to be $-1.6 \times 10^{-15}$ m$^2$/V$^2$. This indicates that electrostriction begins to dominate for fields greater than about 1 MV/m.

Many modifications and variations of the present invention are possible in light of the above teachings. It is therefore to be understood that, within the scope of the claims and their equivalents, the invention may be practiced otherwise than as specifically described.

We claim:

1. A process for making a vinylidene fluoride-co-trifluoroethylene networked polymer comprising the steps of:

providing a poly(vinylidene fluoride-co-trifluoroethylene) copolymer;
  wherein the poly(vinylidene fluoride-co-trifluoroethylene) copolymer is substantially free of cure-site monomers containing iodine;

mixing the copolymer with a peroxide and a coagent to form a curing mixture; and processing the curing mixture such that the peroxide, in combination with the coagent, crosslinks the copolymer to form a networked polymer.

2. The process of claim 1, wherein the copolymer is a random copolymer.

3. The process of claim 1, wherein the mole percent vinylidene fluoride in the copolymer is from about 40% to about 95%.

4. The process of claim 1, wherein the mole percent vinylidene fluoride in the copolymer is from about 60% to about 75%.

5. The process of claim 1, wherein the peroxide is a strong peroxide.

6. The process of claim 1, wherein the peroxide is selected from the group consisting of dicumyl peroxide and $\alpha,\alpha'$-bis(t-butylperoxy)diisopropylbenzene.

7. The process of claim 1, wherein the amount of peroxide in the curing mixture is up to about 15% by weight of the amount of copolymer.

8. The process of claim 1, wherein the coagent is selected from the group consisting of trimethallyl isocyanurate, triallyl isocyanurate, and 4'-methylenebis(cyclohexylamine) carbamate.

9. The process of claim 1, wherein the amount of coagent in the curing mixture is up to about 15% by weight of the amount of copolymer.

10. The process of claim 1, wherein the mixing step comprises mechanically mixing the copolymer, peroxide, and coagent in the melt state.

11. The process of claim 10, wherein the mixing is performed as part of an extrusion process.

12. The process of claim 1, wherein the mixing step comprises dissolving the copolymer, peroxide, and coagent in a solvent.

13. The process of claim 1, wherein the mixing step comprises dry blending the copolymer, the peroxide, and the coagent.

14. The process of claim 1, wherein the processing step comprises heating the curing mixture.

15. The process of claim 1, wherein the processing step comprises pressurizing the curing mixture.

16. The process of claim 1, wherein the processing step comprises forming a film comprising the curing mixture.

17. The process of claim 16, wherein the film is formed by an extrusion process.

18. The process of claim 17, wherein the film is heated to form the networked polymer.

19. The process of claim 18, wherein at least some of the heating is performed either during the extrusion process, after the extrusion process, or both.

20. The process of claim 16, wherein the film is pressurized to form the networked polymer.

21. The process of claim 20, wherein at least some of the pressurizing is performed either during the extrusion process, after the extrusion process, or both.

22. The process of claim 16, wherein the film is cast from a solution of copolymer, peroxide, and coagent.

23. The networked polymer formed by the process of claim 1.

24. An electrostrictive film comprising the networked polymer of claim 23.

25. An active sonar device comprising the film of claim 24.

26. The process of claim 1, wherein the poly(vinylidene fluoride-co-trifluoroethylene) copolymer is substantially free of cure-site monomers containing bromine.

27. The process of claim 1, wherein the poly(vinylidene fluoride-co-trifluoroethylene) copolymer is substantially free of monomers other than vinylidene fluoride and trifluoroethylene.

* * * * *